United States Patent
Kim

(10) Patent No.: US 6,617,179 B1
(45) Date of Patent: *Sep. 9, 2003

(54) METHOD AND SYSTEM FOR QUALIFYING AN ONO LAYER IN A SEMICONDUCTOR DEVICE

(75) Inventor: Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/875,056

(22) Filed: Jun. 5, 2001

(51) Int. Cl.[7] .............................................. H01L 21/66
(52) U.S. Cl. ....................................................... 438/17
(58) Field of Search ............................. 438/14, 17, 18; 257/315

(56) References Cited

U.S. PATENT DOCUMENTS 5,420,513 A * 5/1995 Kimura ....................... 324/551
6,509,202 B1 * 1/2003 Kim ............................. 438/17

OTHER PUBLICATIONS

T. Chan et al., "A True Single–Transistor Oxide–Nitride–Oxide EEPROM Device", Mar. 1987, IEEE Electron Device Letters, vol. EDL–8, No. 3, pp. 93–95.*

* cited by examiner

Primary Examiner—Evan Pert
(74) Attorney, Agent, or Firm—Winstead Sechrest & Minick P.C.

(57) ABSTRACT

A method and system for qualifying an oxide-nitride-oxide (QNO) layer including a first oxide layer, a nitride layer and a control oxide layer in a semiconductor device is disclosed. The method and system including determining a first plurality of dielectric breakdown voltages and a first plurality of lifetimes and determining a second plurality of dielectric voltages and a second plurality of lifetimes. The first plurality of dielectric breakdown voltages and lifetimes being determined utilizing a plurality of ramp rates for a first plurality of ONO layers having a particular nitride layer thickness and a plurality of control oxide layer thicknesses. The second plurality of dielectric breakdown voltages and lifetimes layer being determined utilizing the plurality of ramp rates for each of a second plurality of ONO layers having a particular control oxide layer thickness and a plurality of nitride layer thicknesses. The method and system include determining a field acceleration factor based on the first and second plurality of dielectric breakdown voltages and an activation energy based on the first and second plurality of lifetimes. The method and system also include determining a lifetime for the ONO layer based upon the field acceleration factor and the activation energy for the ONO layer.

12 Claims, 5 Drawing Sheets

Breakdown Voltage

METHOD AND SYSTEM FOR QUALIFYING AN ONO LAYER IN A SEMICONDUCTOR DEVICE

FIELD OF THE INVENTION

The present invention relates to semiconductor devices, and more particularly to a method and system for qualifying an ONO layer in a semiconductor device.

BACKGROUND OF THE INVENTION

FIG. 1 depicts a portion of a conventional semiconductor device 10, such as a Flash memory device. The conventional semiconductor 10 utilizing an oxide-nitride-oxide ("ONO") layer 13 formed on a semiconductor substrate 12. The ONO layer 13 includes two oxide layers separated by a nitride layer 16. The first oxide layer, which is closest to the substrate 12 is a tunnel oxide layer 14. The upper oxide layer is a control oxide layer 18. The thinned portion of the control oxide layer 18 corresponds to a bitline 20 that runs perpendicular to the plane of FIG. 1. The nitride layer 14 acts as a charge storage layer, or a floating gate. Thus, charges can tunnel through the tunnel oxide layer 14 and be trapped on the nitride layer 14. As a result, the threshold voltage of a device utilizing the ONO layer 13 is changed. In order to alter the threshold voltage, a voltage is typically applied to the control oxide layer 18.

Typically, devices made using the ONO layer 13 are desired to be qualified, or investigated to determine that their properties meet certain specifications. In particular, it is desirable to ensure that when the ONO layer 13 is included in a device, such as a flash memory device, the ONO layer 13 will have a particular lifetime. It is, therefore, desirable to qualify the ONO layer 13.

One property of the ONO layer 13 desired to be determined during qualification is the lifetime of the ONO layer 13. Predicting the lifetime of the ONO layer 13, particularly in structures such as the bitline 20, is difficult. The ONO layer 13 [is a multiplayer] has multiple layers. As such, different layers within the ONO layer, such as the tunnel oxide 14, the nitride 16 and the control oxide 18, may have different properties. These layers 14, 16 and 18 within the ONO layer 13 therefore have different lifetimes. As a result, the lifetime of the ONO layer 13 could vary. Consequently, reliably predicting the lifetime of the ONO layer 13 is difficult.

Accordingly, what is needed is a system and method for qualifying an ONO layer. The present invention addresses such a need.

SUMMARY OF THE INVENTION

The present invention provides a method and system for qualifying an oxide-nitride-oxide (ONO) layer including a first oxide layer, a nitride layer and a control oxide layer in a semiconductor device. The method and system comprise determining a first plurality of dielectric breakdown voltages and a first plurality of lifetimes and determining a second plurality of dielectric voltages and a second plurality of lifetimes. The first plurality of dielectric breakdown voltages and lifetimes being determined utilizing a plurality of ramp rates for a first plurality of ONO layers having a particular nitride layer thickness and a plurality of control oxide layer thicknesses. The second plurality of dielectric breakdown voltages and lifetimes layer being determined utilizing the plurality of ramp rates for each of a second plurality of ONO layers having a particular control oxide layer thickness and a plurality of nitride layer thicknesses. The method and system comprise determining a field acceleration factor based on the first and second plurality of dielectric breakdown voltages and an activation energy based on the first and second plurality of lifetimes. The method and system also comprise determining a lifetime for the ONO layer based upon the field acceleration factor and the activation energy for the ONO layer.

According to the system and method disclosed herein, the present invention provides a method for rapidly qualifying an ONO layer as well as selecting thicknesses of the control oxide and nitride layer that can improve performance of the ONO layer.

DETAILED DESCRIPTION OF THE INVENTION

The present invention relates to an improvement in characterization of semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for qualifying an oxide-nitride-oxide (ONO) layer including a first oxide layer, a nitride layer and a control oxide layer in a semiconductor device. The method and system comprise determining a first plurality of dielectric breakdown voltages and a first plurality of lifetimes and determining a second plurality of dielectric voltages and a second plurality of lifetimes. The first plurality of dielectric breakdown voltages and lifetimes being determined utilizing a plurality of ramp rates for a first plurality of ONO layers having a particular nitride layer thickness and a plurality of control oxide layer thicknesses. The second plurality of dielectric breakdown voltages and lifetimes layer being determined utilizing the plurality of ramp rates for each of a second plurality of ONO layers having a particular control oxide layer thickness and a plurality of nitride layer thicknesses. The method and system comprise determining a field acceleration factor based on the first and second plurality of dielectric breakdown voltages and an activation energy based on the first and second plurality of lifetimes. The method and system also comprise determining a lifetime for the ONO layer based upon the field acceleration factor and the activation energy for the ONO layer.

The present invention will be described in terms of a particular method having certain steps. Furthermore, for clarity, certain steps may be omitted. However, the present invention is consistent with a method having additional or different steps. In addition, the present invention is described in the context of a particular device. However, one of ordinary skill in the art will readily recognize that the present invention can be used with other devices having an ONO layer.

Figure 2:
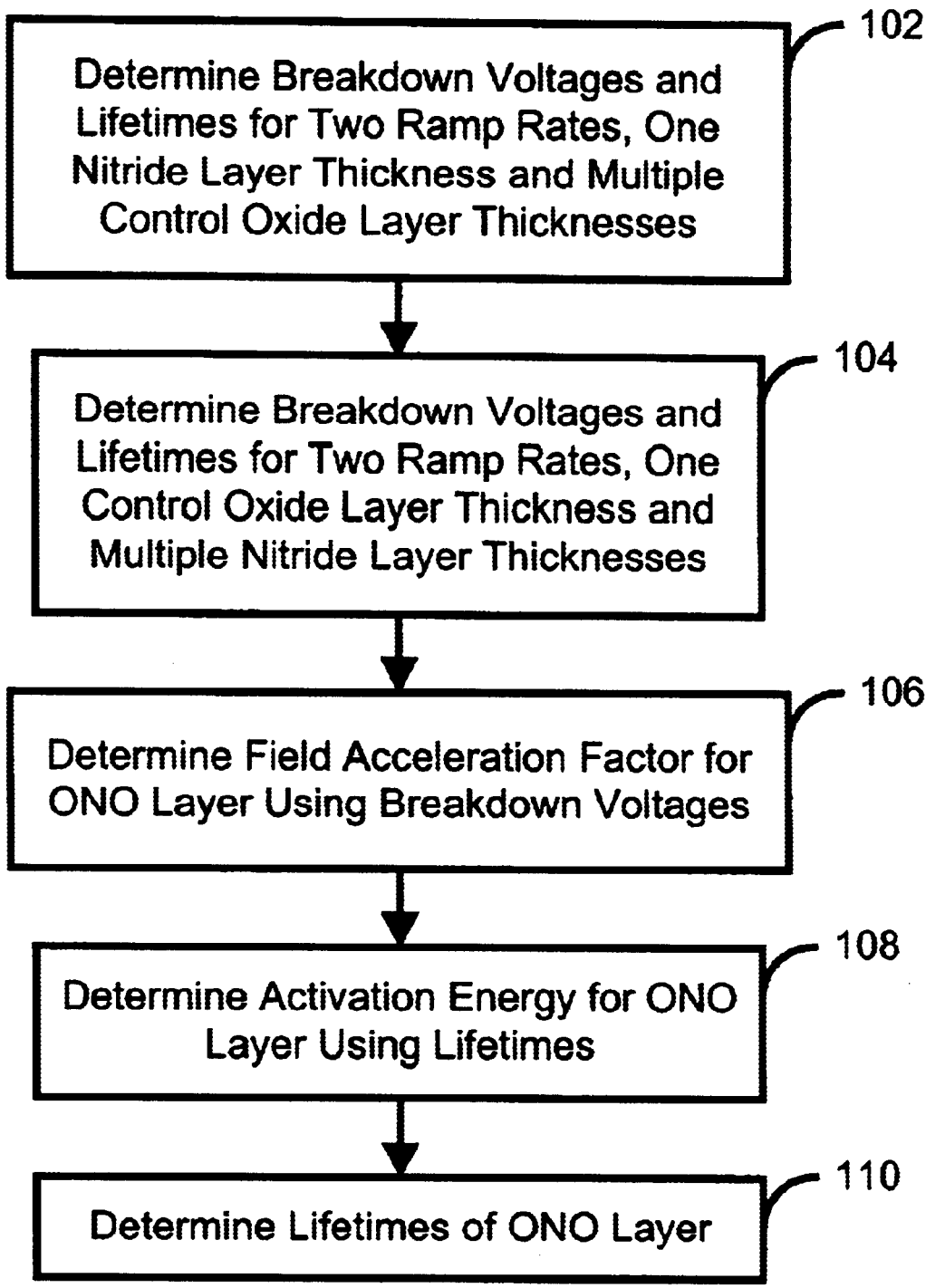
FIG. 2 is a high-level flow chart depicting one embodiment of a method in accordance with the present invention for qualifying an ONO layer.

To more particularly illustrate the method and system in accordance with the present invention, refer now to FIG. 2, depicting a high-level flow chart of one embodiment of a method 100 for qualifying an ONO layer in accordance with the present invention. The ONO layer includes a first, tunnel oxide layer, a nitride layer and a second, control oxide layer. Dielectric breakdown voltages for certain ONO layers are determined using two ramp rates and a plurality of temperatures, via step 102. For a particular ramp rate, a particular voltage is applied to the ONO layer for a particular time. The voltage is then increased to a next higher level. This process of applying a constant voltage, then increasing the voltage and reapplying the voltage to the ONO layer is then repeated until the ONO layer undergoes dielectric breakdown. Thus, after a particular time, the voltage is increased by a particular amount. In addition to utilizing two ramp rates, multiple ONO layers are used in step 102. ONO layers having a particular thickness for the nitride layer and multiple thicknesses for the control oxide layers are utilized in step 102. In a preferred embodiment, three ONO layers are tested, each having the same nitride layer and (three) different control oxide thicknesses. Furthermore, each ONO layer is tested at multiple temperatures, preferably using both ramp rates at each temperature.

Dielectric breakdown voltages for other certain ONO layers are determined using two ramp rates and multiple temperatures, via step 104. These ramp rates are preferably the same ramp rates as used in the step 102, but could be different ramp rates. In addition to utilizing two ramp rates, multiple ONO layers are used in step 104. ONO layers having a particular thickness for the control layer and multiple thickness for the control oxide layers are utilized in step 104. In a preferred embodiment, three ONO layers are tested, each having the same nitride layer and (three) different control oxide thickness. Furthermore, each ONO layer is tested at multiple temperatures, preferably using both ramp rates at each temperature.

Figure 1:
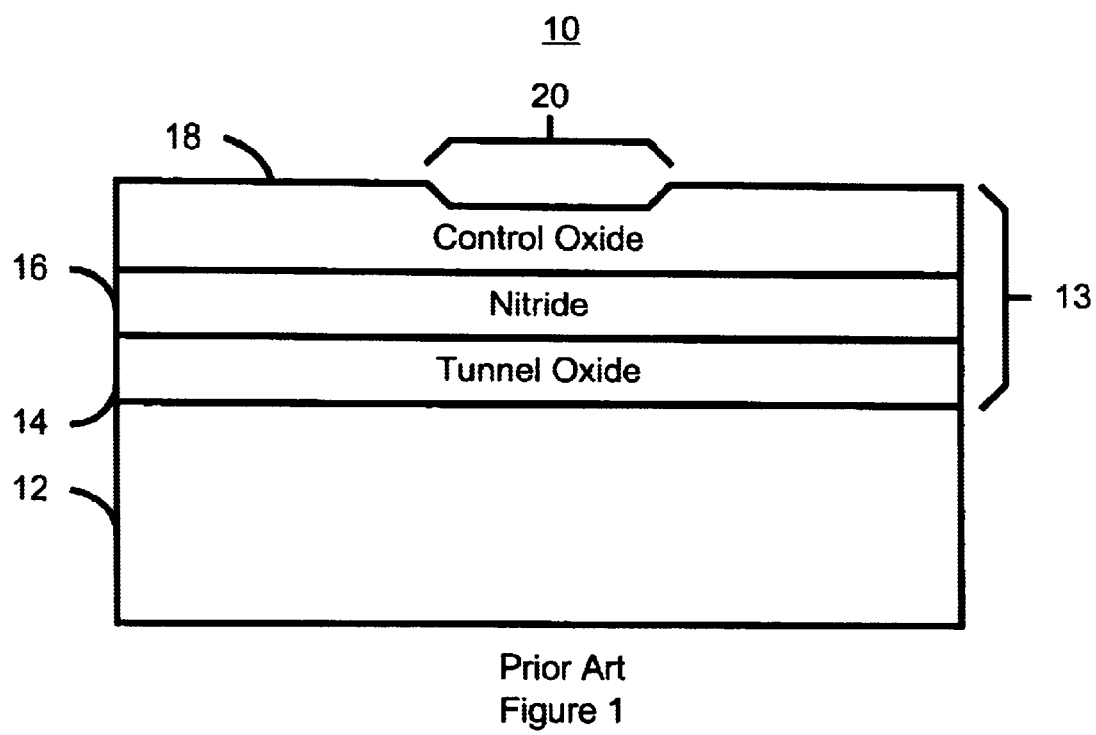
FIG. 1 is a diagram of a conventional ONO layer.
Figure 3:
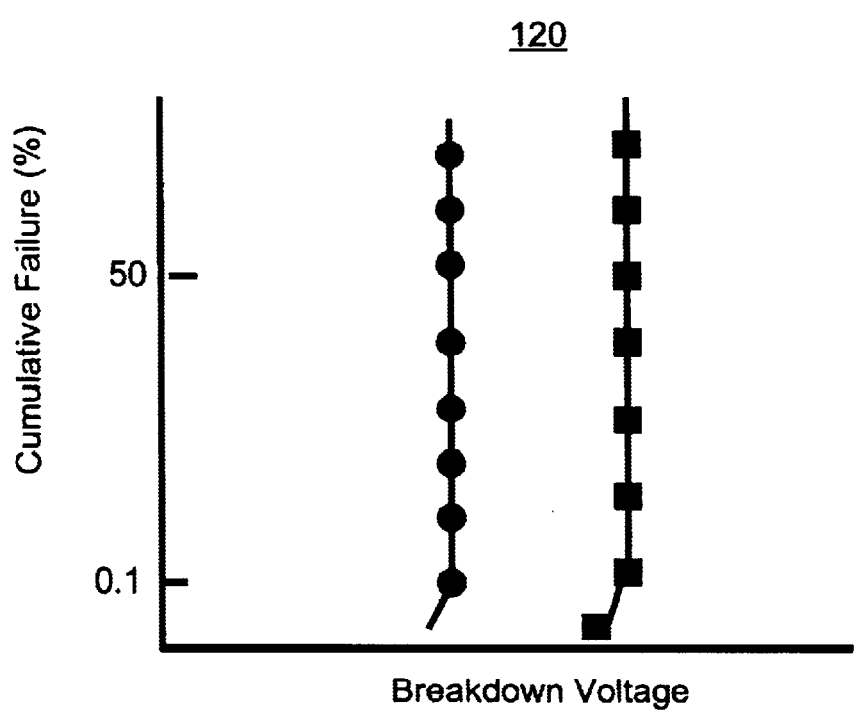
FIG. 3 is a graph depicting failure percentage versus breakdown voltage.

The field acceleration factor for the ONO layer is determined, via step 106. The field acceleration factor is determined in step 106 based on the dielectric breakdown voltages determined both in step 102 and step 104. FIG. 3 is a graph 120 depicting the cumulative failure percentage versus dielectric breakdown voltage for two ramp rates. The curve 122 having lower breakdown voltages and data points marked in circles is for a ramp having a lower rate (longer duration at each voltage); The curve 124 having higher breakdown voltages and data points marked by squares is for a ramp having a higher rate (a shorter duration at each voltage). Using these curves, particularly the information at a fifty percent. cumulative failure percentage, and the relationship between the expected lifetime and the breakdown voltage, the field acceleration factor can be determined.

Referring back to FIG. 2, the field acceleration factor is determined in step. 106 using the expected lifetime of the ONO layer. The expected lifetime of the ONO layer, $t_{exp}$, is given by:

$$\ln(t_{exp}) = \ln(t_{init}) + B(V_{bd} - V_{op}) \quad (1)$$

where:

$t_{init}$=ramp duration (time for which voltage is constant)

B=field acceleration factor $V_{bd}$=breakdown voltage at fifty percent accumulative failure $V_{op}$=operating voltage In a preferred embodiment, the field acceleration factor for the ONO layer is determined by determining a field acceleration factor for the control oxide layer and by determining a field acceleration factor for the nitride layer. The field acceleration factor for the control oxide layer can be determined using the above relationship and the information obtained in step 102. In particular, the two ramp rates can be used to remove the operating voltage from the above equation. The breakdown voltage at fifty percent cumulative failure and the lifetime of the ONO layer can be determined in step 102. The ramp duration is also known for the two ramp rates. The field acceleration factor for the nitride layer can be determined in a similar manner using the breakdown voltages and lifetimes determined in step 104.

An activation energy for the ONO layer is determined, via 108. The activation energy determined in step 108 based on the lifetimes determined in step 102 and step 104. In a preferred embodiment, the activation energy of the ONO layer is determined using the activation energy of the control oxide layer and the activation energy of the nitride layer. The activation energy of the control oxide layer is determined using the lifetimes obtained in step 102. Similarly, the activation energy of the nitride layer is determined using the lifetimes obtained in step 104. The activation energy is the slope of the curve of the lifetime versus the temperature.

Once the activation energy and field acceleration factor for the ONO layer are obtained, the lifetime for the ONO layer is determined based upon the field acceleration factor and the activation energy for the ONO layer, via step 110. In a preferred embodiment, the lifetime of the ONO layer, $T_{ONO}$, is given by:

$$T_{ONO} = t_{ono}[\exp\{(E_{ONO}/k)(T_{OP}+273)^{-1} - (T_{test}+273)^{-1}\}] \quad (2)$$

where:

$t_{ono}$=expected lifetime of ONO layer $\ln(t_{ono}) = \ln(t_{exp}) + B_{ONO}(V_{bdONO} - V_{opONO})$ $t_{exp}$=ramp duration (time for which voltage is constant)

$B_{ONO}$=field acceleration factor for the ONO layer $V_{bdONO}$=breakdown voltage of the ONO layer at fifty percent accumulative failure $V_{opONO}$=operating voltage of the ONO layer $E_{ONO}$=activation energy of the ONO layer k=Boltzman's constant $T_{op}$=Operating temperature of ONO layer (in degrees C)

$T_{test}$=Test temperature (usually higher than operating temp) (in degrees C)

Thus, the lifetime of the ONO layer can be predicted using the method 100. As a result, the ONO layer can be qualified. Furthermore, because ramped voltages are used in steps 102 and 104, the method 100 is relatively fast. Thus, less time may be spent in qualifying the ONO layer. In addition, because several different control oxide and nitride layer thicknesses are used, the relationship between lifetime of the ONO layer versus control oxide and nitride layer thicknesses can be determined. As a result, control oxide layer and nitride layer thicknesses can be selected so that the ONO layer lifetime is improved.

Figure 4A:
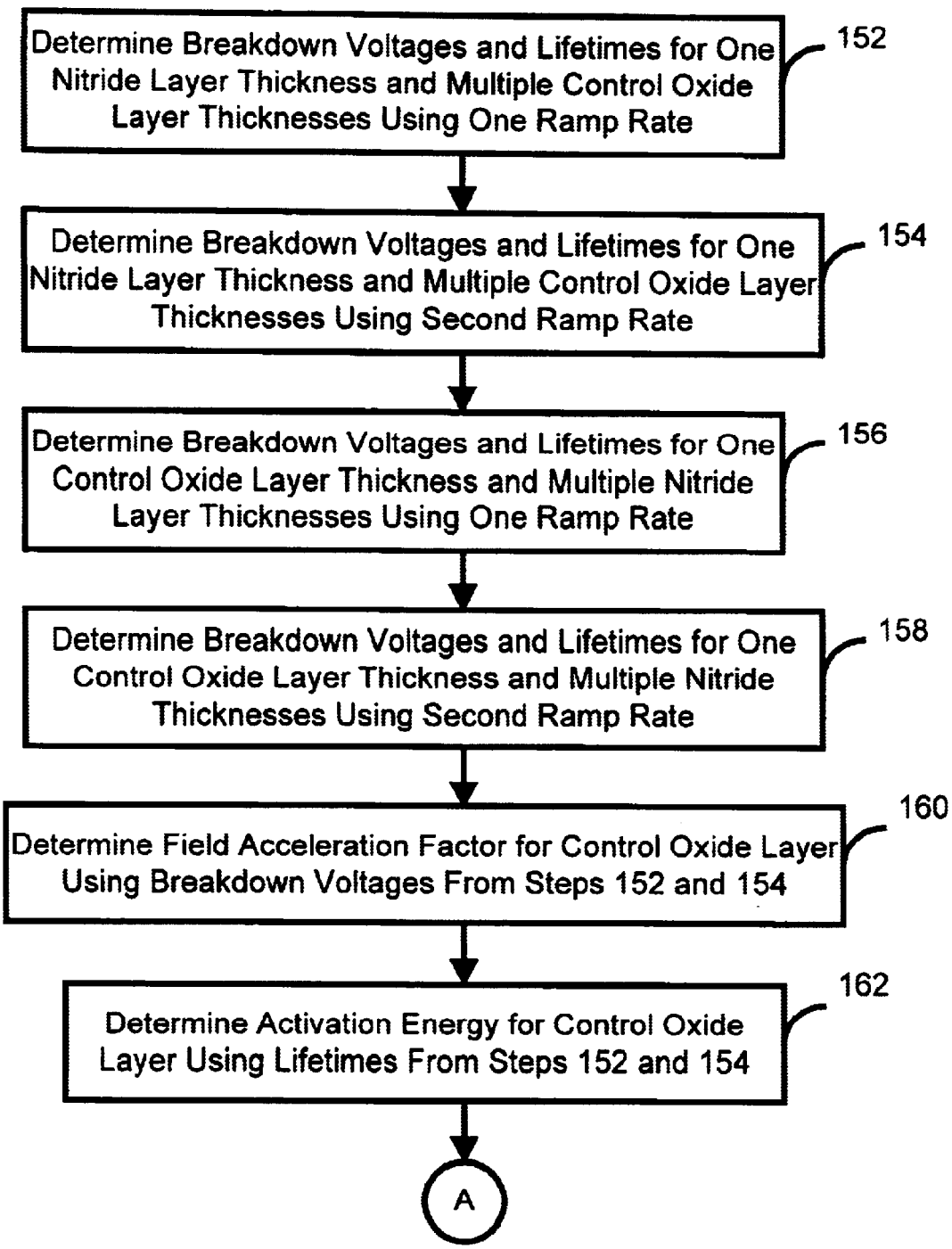
FIGS. 4A and 4B depict a more detailed flow chart depicting one embodiment of a method in accordance with the present invention for qualifying an ONO layer.
Figure 4B:
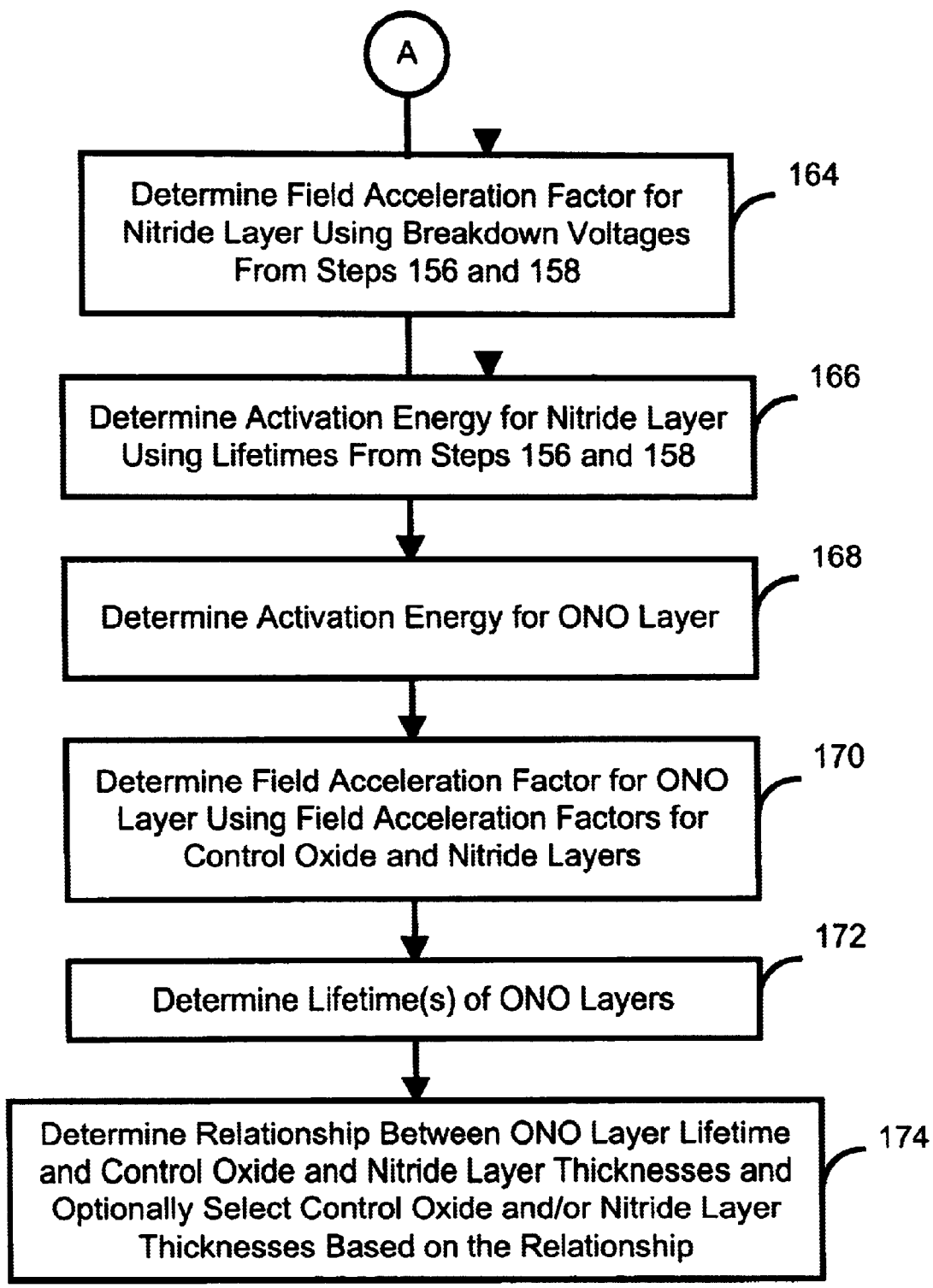

FIGS. 4A and 4B depict a more detailed flow chart depicting one embodiment of a method 150 in accordance with the present invention for qualifying an ONO layer. The ONO layer includes a first, tunnel oxide layer, a nitride layer and a second, control oxide layer. The dielectric breakdown voltages and lifetimes for ONO layers having a single nitride layer thickness and multiple control oxide layer thicknesses are obtained at a first ramp rate, via step 152. For the first ramp rate, a particular voltage is applied to the ONO layer for a particular time. The voltage is then increased to a next higher level. This process of applying a constant voltage, then increasing the voltage and reapplying the voltage to the ONO layer is then repeated until the ONO layer undergoes dielectric breakdown. Thus, after a particular time, the voltage is increased by a particular amount. The dielectric breakdown voltages and lifetimes for ONO layers having the single nitride layer thickness and multiple control oxide layer thicknesses at a second ramp rate, via step 154. Step 154 basically repeats step 152 on ONO layers having the same single nitride thickness and the multiple control oxide layer thicknesses, but uses a different ramp rate. In a preferred embodiment, three ONO layers are tested in steps 152 and 154. The ONO layers tested have the same nitride layer and (three) different control oxide thicknesses. Thus, steps 152 and 154 are analogous to step 102 of the method 100 depicted in FIG. 2.

Referring back to FIGS. 4A and 4B, the dielectric breakdown voltages and lifetimes for ONO layers having a single control oxide layer thickness and multiple nitride layer thicknesses are obtained at a first ramp rate, via step 156. For the first ramp rate, a particular voltage is applied to the ONO layer for a particular time. The voltage is then increased to a next higher level. This process of applying a constant voltage, then increasing the voltage and reapplying the voltage to the ONO layer is then repeated until the ONO layer undergoes dielectric breakdown. Thus, after a particular time, the voltage is increased by a particular amount. The dielectric breakdown voltages and lifetimes for ONO layers having the single control oxide layer thickness and multiple nitride layer thicknesses at a second ramp rate, via step 158. Step 158 basically repeats step 156 on ONO layers having the same single nitride thickness and the multiple control oxide layer thicknesses, but uses a different ramp rate. In a preferred embodiment, three ONO layers are tested in steps 156 and 158. The ONO layers tested have the same nitride layer and (three) different control oxide thicknesses. Thus, steps 156 and 158 are analogous to step 104 of the method 100 depicted in FIG. 2.

Referring back to FIGS. 4A and 4B, the field acceleration factor is determined for the control oxide layer, via step 160. The field acceleration factor is determined using the formula (1), the two ramp rates and the breakdown voltages obtained in steps 152 and 154. Assuming the subscripts 1 and 2 refer to the first and second ramp rates, filling in formula (1) for both ramp rates give:

$$\ln(t_{exp1}) = \ln(t_{init1}) + B_{control\ oxide}(V_{bd2} - V_{op2}) \quad (3)$$

$$\ln(t_{exp2}) = \ln(t_{init2}) + B_{control\ oxide}(V_{bd2} - V_{op2}) \quad (4)$$

For equal operating voltages, subtracting (4) from (3) gives:

$$\ln\{(t_{exp1})/(t_{exp2})\} = \ln\{(t_{init1}/t_{init2})\} + B_{control\ oxide}(V_{bd1} - V_{bd2}) \quad (5)$$

Because $t_{exp1}$, $t_{exp2}$, $t_{init1}$, $t_{init2}$, $V_{bd1}$ and $V_{bd2}$ are known, $B_{control\ oxide}$ can be determined.

The activation energy for the control oxide layer, $E_{acontrolox}$, is determined; via step 162. Step 162 is preferably performed by determining the relationship between the lifetime of the ONO layer and the temperature of the ONO layer and finding the slope of the curve representing this relationship. The field acceleration factor, $B_{nitride}$, for the nitride layer is determined, via step 164. Step 164 is performed in substantially the same way as step 160, except that the breakdown voltages obtained in steps 156 and 158. The activation energy for the nitride layer, $E_{nitride}$, is determined in step 166. Step 166 is performed in a similar manner to step 162, however, the lifetimes from steps 156 and 158 (varying nitride layer thickness) are used.

The activation energy for the ONO layer, $E_{ONO}$, is then determined using the activation energy for the control oxide layer and the activation energy for the nitride layer, via step 168. The activation energy for the ONO layer can be calculated using the following:

$$1/E_{ONO} = 1/E_{control\ oxide} + 1/E_{nitride} \quad (6)$$

The field acceleration factor for the ONO layer, $B_{ONO}$, is then determined, via step 170. The field acceleration factor for the ONO layer is determined based on the field acceleration factor for the nitride layer and the field acceleration factor for the control oxide layer. The field acceleration factor for the ONO layer can be calculated using the following:

$$B_{ONO} = 1/B_{control\ oxide} + 1/B_{nitride} \quad (7)$$

The lifetime for the ONO layer is then determined using equation (2) and the quantities that are known (such as the breakdown voltage) or calculated (such as $B_{ONO}$), via step 172.

The desired thicknesses for the nitride and control oxide layers is then determined, via step 174. Preferably, step 174 includes determining the relationship between the lifetime for the ONO layer and the nitride and control oxide layer thicknesses. This mathematical relationship can be viewed as a surface in three dimensions. Based on this relationship, the optimal control oxide thickness and the optimal nitride layer thickness can be selected. These optimal thicknesses result in a longer ONO lifetime. In a preferred embodiment, the optimal control oxide layer thickness and the optimal nitride layer thickness result in the longest ONO layer lifetime. However, the control oxide layer thickness and the nitride layer thickness selected in step 174 are preferably at or close to the nitride layer and control oxide thicknesses tested in steps 152, 154, 156 and 158. It is desirable for these optimal thicknesses to be at or close to the tested thicknesses because there is some variation in the activation energy and field acceleration factor with thickness.

Thus, the method 150 allows a ONO layer having a higher lifetime to be provided by determining the desired control oxide and nitride layer thicknesses. Furthermore, because the method 150 uses two ramps rates, the method 150 is relatively fast.

Figure 5:
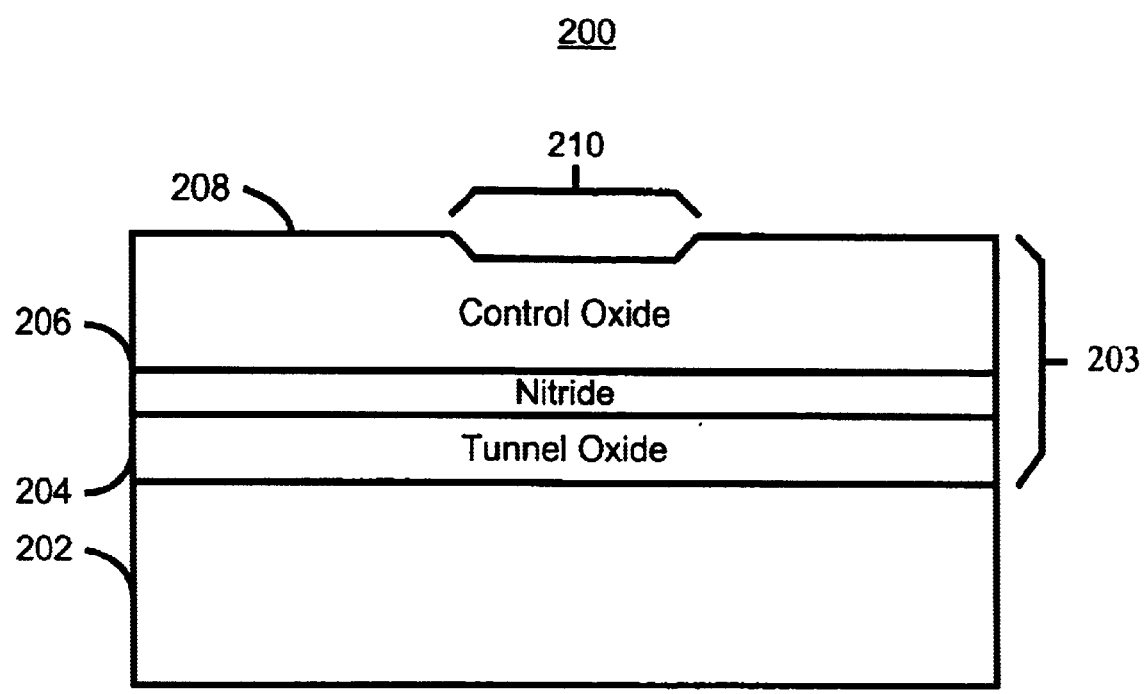
FIG. 5 is a diagram of an ONO layer in accordance with the present invention.

FIG. 5 depicts a portion of a semiconductor device 200 in accordance with the present invention, such as a Flash memory device. The conventional semiconductor 200 utilizes an ONO layer 203 formed on a semiconductor substrate 202. The ONO layer 203 includes two oxide layers 204 and 208 separated by a nitride layer 206. The first oxide layer 204, which is closest to the substrate 202 is a tunnel oxide layer 204. The upper oxide layer is a control oxide layer 208. The thinned portion of the control oxide layer 208 corresponds to a bitline 210 that runs perpendicular to the plane of FIG. 5. The ONO layer 203 is qualified using the method 100 and 150. In addition, in a preferred embodiment, the ONO layer 203 has the thicknesses of the control oxide 208 and the nitride layer 206 set using the method 150. Thus, the thicknesses of the control oxide layer 208 and the nitride layer 206 are optimal.

Thus, the method 100 and 150 can qualify an ONO layer. Furthermore, because the voltage is ramped up to determine the breakdown voltage, the methods 100 and 150 can be performed relatively quickly. In addition, the methods 100 and 150 can be used to provide a semiconductor device, such as the semiconductor device 200, in which the nitride and control oxide layers have thicknesses selected to improve the lifetime of the ONO layer.

A method and system has been disclosed for qualifying an ONO layer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for qualifying an oxide-nitride-oxide (ONO) layer including a first oxide layer, a nitride layer and a control oxide layer in a semiconductor device, the method comprising the steps of:

(a) determining a first plurality of dielectric breakdown voltages and a first plurality of lifetimes for the ONO layer utilizing a plurality of ramp rates for each of a first plurality of ONO layers having a particular nitride layer thickness and a plurality of control oxide layer thicknesses;

(b) determining a second plurality of dielectric breakdown voltages and a second plurality of lifetimes for the ONO layer utilizing the plurality of ramp rates for each of a second plurality of ONO layers having a particular control oxide layer thickness and a plurality of nitride layer thicknesses;

(c) determining a field acceleration factor for the ONO layer based on the first plurality of dielectric breakdown voltages and the second plurality of dielectric breakdown voltages;

(d) determining an activation energy for the ONO layer based on the first plurality of lifetimes and the second plurality of lifetimes; and (e) determining a lifetime for the ONO layer based upon the field acceleration factor and the activation energy for the ONO layer.

2. The method of claim 1 wherein the field acceleration factor determining step (c) further includes the step of:

(c1) determining a control oxide field acceleration factor using the first plurality of breakdown voltages;

(c2) determining a nitride field acceleration factor using the second plurality of breakdown voltages; and (c3) determining the field acceleration factor for the ONO layer based on the control oxide field acceleration factor and the nitride field acceleration factor.

3. The method of claim 1 wherein the activation energy determining step (d) further includes the steps of:

(d1) determining a control oxide activation energy using the first plurality of lifetimes;

(d2) determining a nitride activation energy using the second plurality of lifetimes; and (d3) determining the activation energy based on the control oxide activation energy and the nitride activation energy.

4. The method of claim 1 further including the step of:

(f) determining a relationship between the lifetime of the ONO layer, a nitride layer thickness and a control oxide layer thickness.

5. The method of claim 4 further comprising the step of:

(g) determining an optimal control oxide layer thickness and an optimal nitride layer thickness based on the relationship between the lifetime of the ONO layer, a nitride layer thickness and a control oxide layer thickness.

6. A method of designing a semiconductor device having an ONO layer including a nitride layer and a control oxide layer, the method comprising:

determining a relationship between an ONO layer lifetime, nitride layer thickness, and control oxide layer thickness; and selecting a nitride layer thickness and control oxide layer thickness responsive to a desired ONO layer lifetime.

7. The method of claim 6, wherein determining a relationship between an ONO layer lifetime, nitride layer thickness, and control oxide layer thickness comprises:

determining a field acceleration factor and an activation energy of the ONO layer for each of a plurality of combinations of nitride layer thickness and control oxide layer thickness; and calculating ONO layer lifetimes responsive to the field acceleration factors and activation energies.

8. The method of claim 7, wherein determining a field acceleration factor and an activation energy of the ONO layer for each of a plurality of combinations of nitride layer thickness and control oxide layer thickness comprises:

determining a field acceleration factor and an activation energy of a nitride layer at a plurality of different thicknesses; and determining a field acceleration factor and an activation energy of a control oxide layer at a plurality of different thicknesses; and calculating the field acceleration factor and an activation energy of the ONO layer from the field acceleration factor and an activation energy of the nitride layer and control oxide layer for each of a combinations of nitride layer thickness and control oxide layer thickness.

9. The method of claim 8, wherein determining a field acceleration factor of a selected one of the nitride layer and the control oxide layer comprises:

determining a first expected lifetime and a first dielectric breakdown voltage of the selected layer at a first ramp rate;

determining a second expected lifetime and a second dielectric breakdown voltage of the selected layer at a second ramp rate; and calculating a field acceleration factor responsive to the first and second expected lifetimes, the first and second breakdown voltages, and the first and second ramp rates.

10. The method of claim 6, wherein determining a relationship between an ONO layer lifetime, nitride layer thickness, and control oxide layer thickness comprises:

determining a first plurality of field acceleration factors and an activation energies for a first plurality of ONO layers having the same nitride layer thickness and different control oxide layer thickness;

determining a second plurality of field acceleration factors and an activation energies for a second plurality of ONO layers having the same control oxide layer thickness and different nitride layer thickness; and calculating ONO layer lifetimes responsive to the first and second pluralities of field acceleration factors and activation energies.

11. The method of claim 10, wherein determining a field acceleration factor of a selected one of the nitride layer and the control oxide layer comprises:

- determining a first expected lifetime and a first dielectric breakdown voltage of the selected layer at a first ramp rate;
- determining a second expected lifetime and a second dielectric breakdown voltage of the selected layer at a second ramp rate; and
- calculating a field acceleration factor responsive to the first and second expected lifetimes, the first and second breakdown voltages, and the first and second ramp rates.

12. The method of claim 11 wherein determining an expected lifetime and a dielectric breakdown voltage of the selected layer comprises:

- applying a voltage to the ONO layer;
- waiting a predetermined interval corresponding to the ramp rate;
- monitoring the ONO layer for dielectric breakdown;
- increasing the voltage applied to the ONO layer at the end of the interval if dielectric breakdown has not occurred; and
- repeating the steps of waiting, monitoring, and increasing until dielectric breakdown occurs.

\* \* \* \* \*

UNITED STATES PATENT AND TRADEMARK OFFICE
CERTIFICATE OF CORRECTION

PATENT NO. : 6,617,179 B1  Page 1 of 1
DATED : September 9, 2003
INVENTOR(S) : Hyeon-Seag Kim It is certified that error appears in the above-identified patent and that said Letters Patent is hereby corrected as shown below:

Column 2,
Line 12, following "layer" please insert -- , --.

Column 5,
Line 61, following "determined" please replace ";" with -- , --.

Column 6,
Line 22, please replace "$B_{ONO}=1/B_{control\ oxide} +1/B_{nitride}$" with -- $1/B_{ONO}=1/B_{control\ oxide} +1/B_{nitride}$ --.

Column 7,
Line 30, please replace "asecond" with -- a second --.

Signed and Sealed this

Ninth Day of December, 2003

JAMES E. ROGAN
*Director of the United States Patent and Trademark Office*